US012713839B2

(12) United States Patent
Gottwald et al.

(10) Patent No.: US 12,713,839 B2
(45) Date of Patent: Aug. 18, 2026

(54) FREE LAYER IN MAGNETORESISTIVE RANDOM-ACCESS MEMORY

(71) Applicant: INTERNATIONAL BUSINESS MACHINES CORPORATION, Armonk, NY (US)

(72) Inventors: Matthias Georg Gottwald, Ridgefield, CT (US); Guohan Hu, Yorktown Heights, NY (US); Virat Vasav Mehta, Menands, NY (US); John Bruley, Poughkeepsie, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 400 days.

(21) Appl. No.: 18/358,057

(22) Filed: Jul. 25, 2023

(65) Prior Publication Data

US 2025/0040444 A1 Jan. 30, 2025

(51) Int. Cl.

*H10N 50/85* (2023.01)
*H01F 10/32* (2006.01)

(Continued)

(52) U.S. Cl.

CPC ......... *H10N 50/85* (2023.02); *H01F 10/3254* (2013.01); *H01F 10/3286* (2013.01); *H10B 61/00* (2023.02); *H10N 50/01* (2023.02)

(58) Field of Classification Search

CPC ........ H10N 50/85; H10N 50/01; H10N 50/10; H01F 10/3254; H01F 10/3286;

(Continued)

(56) References Cited

U.S. PATENT DOCUMENTS

| | | | |
|---|---|---|---|
| 8,456,897 | B2 | 6/2013 | Ranjan |
| 9,166,143 | B1 | 10/2015 | Gan |

(Continued)

FOREIGN PATENT DOCUMENTS

| | | | |
|---|---|---|---|
| CN | 111364012 | A | 7/2020 |
| WO | 2019/005082 | A1 | 1/2019 |

OTHER PUBLICATIONS

Bouchikhaoui et al., "Nano-analysis of Ta/FeCoB/MgO tunnel magneto resistance structures", Acta Materialia, Sep. 2016, pp. 298-307, vol. 116.

International Searching Authority, "Notification of Transmittal of the International Search Report and the Written Opinion of the International Searching Authority, or Declaration," Patent Cooperation Treaty, Oct. 21, 2024, 17 pages, International Application No. PCT/EP2024/068888.

(Continued)

*Primary Examiner* — Caleen O Sullivan
*Assistant Examiner* — Brett Squires
(74) *Attorney, Agent, or Firm* — Yuanmin Cai

(57) ABSTRACT

Embodiments of present invention provide a magnetoresistive random-access-memory (MRAM). The MRAM includes a reference layer; a tunnel barrier layer of magnesium-oxide (MgO); and a free layer, where the free layer includes a first cobalt-iron-boron (CoFeB) layer on top of the tunnel barrier layer; a spacer layer on top of the first CoFeB layer; a second CoFeB layer on top of the spacer layer; and a capping layer of MgO on top of the second CoFeB layer. Additionally, the first and the second CoFeB layer are substantially depleted of boron (B) to include respectively a first region adjacent to the tunnel barrier layer and the capping layer respectively and a second region adjacent to the spacer layer, where the first regions of the first and the second CoFeB layer include crystallized cobalt-iron (CoFe) and the second regions of the first and the second CoFeB layer include amorphous CoFe alloy.

16 Claims, 10 Drawing Sheets

(51) Int. Cl.
*H10B 61/00* (2023.01)
*H10N 50/01* (2023.01)

(58) Field of Classification Search
CPC ........ H01N 50/01; H01N 50/10; H10B 61/00; H10B 61/10
See application file for complete search history.

(56) References Cited

U.S. PATENT DOCUMENTS

| | | | | |
|---|---|---|---|---|
| 9,373,781 | B2 | 6/2016 | Tang | |
| 9,472,752 | B2 | 10/2016 | Wang | |
| 10,147,873 | B2 * | 12/2018 | Lee | G11C 11/161 |
| 10,347,277 | B2 | 7/2019 | Campiglio | |
| 10,516,097 | B2 | 12/2019 | Park | |
| 11,171,285 | B1 | 11/2021 | Lai | |
| 2014/0001586 | A1 | 1/2014 | Shen et al. | |
| 2014/0038314 | A1 | 2/2014 | Yuchen | |
| 2016/0111634 | A1 | 4/2016 | Lee et al. | |
| 2020/0106003 | A1 | 4/2020 | Gottwald | |
| 2022/0059270 | A1 * | 2/2022 | Guo | H01F 10/3254 |

OTHER PUBLICATIONS

Gottwald et al., "Paramagnetic FexTa1—x alloys for engineering of perpendicularly magnetized tunnel junctions", APL Materials, vol. 1, Letter | Aug. 9, 2013, 6 pages.

Honjo et al., "Impact of Tungsten Sputtering Condition on Magnetic and Transport Properties of Double-MgO Magnetic Tunneling Junction With CoFeB/W/CoFeB Free Layer", IEEE Transactions on Magnetics, vol. 53 No. Nov. 11, 2017, pp. 1-4.

Miura et al. "Insertion Layer Thickness Dependence of Magnetic and Electrical Properties for Double-CoFeB/MgO-Interface Magnetic Tunnel Junctions", IEEE Transactions on Magnetics, vol. 55, No. 7, Jul. 2019, 4 pages.

Park et al., "Effect of Adjacent Layers on Crystallization and Magnetoresistance in CoFeB/MgO/CoFeB Magnetic Tunnel Junction", IEEE transactions on Magnetics, vol. 42, No. 10, Oct. 2006, pp. 2639-2641.

Park et al., "Influence of Boron Diffusion on Transport and Magnetic Properties in CoFeB/MgO/CoFeB Magnetic Tunnel Junction", IEEE Transactions on Magnetics, vol. 45, No. 10, Oct. 2009, pp. 3457-3459.

* cited by examiner

FREE LAYER IN MAGNETORESISTIVE RANDOM-ACCESS MEMORY

BACKGROUND

The present application relates to manufacturing of semiconductor integrated circuits. More particularly, it relates to method of forming a free layer in a magnetoresistive random-access memory and the structure formed thereby.

Semiconductor memory devices are well recognized as playing an extreme important role in managing and organizing digital information which, in recent years, has experienced explosive growth and is constantly transforming our society. Magnetoresistive random-access memory (MRAM) is a type of non-volatile memory (NVM) and particularly a spin-transfer torque MRAM (STT-MRAM) is known as an embedded NVM (eNVM) that is capable of holding saved digital information without losing them even in the event that supply of power to the STT-MRAM device is down or accidentally cut off. The use of STT-MRAM enables higher densities, lower power consumption, and reduced manufacturing cost of memory devices when it is compared with other types of MRAM devices.

MRAM technology, including STT-MRAM, is based on a magnetic tunnel junction (MTJ) stack that usually includes a tunnel barrier layer that is placed or sandwiched between a reference layer and a free layer. Conventionally, the free layer is made of a cobalt-iron-boron alloy material. The property of the cobalt-iron-boron alloy material has a significant influence on the performance of the MRAM and is under study for further improvement.

STT-MRAM is a type of advanced eNVM device that relies on a MTJ stack for device functionality. A cobalt-iron-boron (CoFeB) alloy is usually used as material for forming a free layer in the MTJ stack. It is known to the inventors that properties of the CoFeB alloy, together with the formation process of the free layer using the CoFeB alloy, have a significant influence on the function of the MTJ stack and the overall operation of the STT-MRAM. For example, when forming the STT-MRAM, in particular the MTJ stack, the free layer needs to be deposited in an amorphous state onto a crystalline tunnel barrier layer which is usually a magnesium-oxide (MgO). To keep the CoFeB in its amorphous state during and after the deposition, the CoFeB alloy is usually deposited from a target containing about 20 to 40 at. % of boron (B).

High content of boron helps in wetting the MgO surface resulting in better uniformity during the formation of the CoFeB free layer. On the other hand, the high content of boron causes the CoFe to stay in an amorphous state, thus reduces the tunnel magnetoresistance (TMR) of the free layer formed thereby, which is not desirable for the performance of MTJ. A free layer structure with a refractory metal layer placed between a first and second CoFeB layers have been introduced to help absorb the excess amount of boron. The refractory metal layer is usually made sufficiently thin such that it does not result in magnetic decoupling of the first and the second CoFeB layer to cause the MTJ device become dysfunctional. However, the thin refractory metal layer is not sufficient to absorb the excessive boron in the free layer.

SUMMARY

Embodiments of present invention provide a magnetoresistive random-access-memory (MRAM). The MRAM includes a reference layer; a tunnel barrier layer of magnesium-oxide (MgO); and a free layer, where the free layer includes a first cobalt-iron-boron (CoFeB) layer on top of the tunnel barrier layer; a spacer layer on top of the first CoFeB layer; a second CoFeB layer on top of the spacer layer; and a capping layer of MgO on top of the second CoFeB layer. Additionally, the first and the second CoFeB layer are substantially depleted of boron (B) to include respectively a first region adjacent to the tunnel barrier layer and the capping layer respectively and a second region adjacent to the spacer layer, wherein the first regions of the first and the second CoFeB layer include crystallized cobalt-iron (CoFe) and the second regions of the first and the second CoFeB layer include amorphous CoFe alloy. The local crystallinity of the first regions helps lead to high tunnel magnetoresistance (TMR), high perpendicular magnetic anisotropy (PMA), and high retention of states as compared with current art. The local amorphous state of the second regions result in less magnetic moment and thus enable faster write time and improved device property distribution.

In one embodiment, the spacer layer includes an alloy of a refractory metal and iron, the refractory metal being zirconium (Zr), niobium (Nb), molybdenum (Mo), hafnium (Hf), tantalum (Ta), rhenium (Re), or tungsten (W).

In another embodiment, the spacer layer includes a concentration level of iron ranging from about 20 atomic percent (at. %) to about 80 at. %.

In yet another embodiment, the first and the second CoFeB layer include less than 5 at. % of boron.

In one embodiment, the first region of the first CoFeB layer has a thickness that is between about 20% to about 40% of a thickness of the first CoFeB layer.

In another embodiment, a thickness of the first region of the first CoFeB layer is between about 0.2 nm and about 0.5 nm, and a thickness of the second region of the first CoFeB layer is between about 0.2 nm and about 0.7 nm.

BRIEF DESCRIPTION OF THE DRAWINGS

The present invention will be understood and appreciated more fully from the following detailed description of embodiments of present invention, taken in conjunction with accompanying drawings of which.

Figure 1:
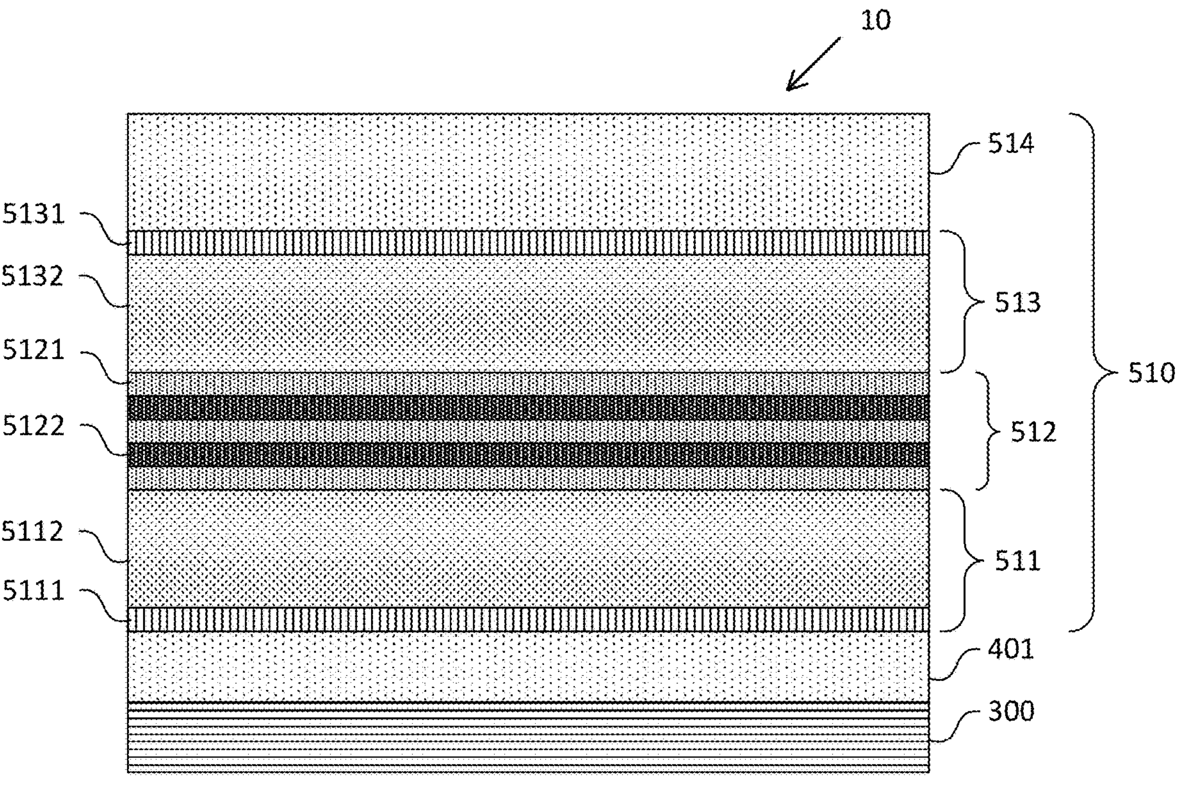
FIG. 1 is a demonstrative illustration of cross-sectional view of a semiconductor structure according to one embodiment of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

Embodiments of present invention provide a structure of free layer that may be used in a MTJ stack for improved functionality of the formed MTJ device. The free layer includes a multilayer sandwich spacer placed between a first and a second cobalt-iron-boron (CoFeB) layer. The multilayer sandwich spacer includes multiple non-magnetic spacers separated by and/or sandwiched between multiple iron interlayers. The multiple non-magnetic spacers, such as multiple refractory metal layers, may provide a big amount of absorption of boron (B) while the multiple iron interlayers may magnetically couple the multiple non-magnetic spacers together and ultimately couple with the first and the second CoFeB layer. In the meantime, the multiple iron interlayers may attract, distribute, and/or absorb some of the boron as well. By using a free layer structure with the multilayer sandwich spacer for the absorption of boron, embodiments of present invention enables the use of a CoFeB target with very high boron content, up to 50 to 60 atomic percent (at. %), during the deposition process of the free layer. The high content of boron in the CoFeB target creates better wetting condition onto the tunnel barrier layer of magnesium-oxide (MgO), thus leading to a more uniform deposition of the CoFeB material.

FIG. 1 is a demonstrative illustration of cross-sectional view of a semiconductor structure according to one embodiment of present invention. More particularly, embodiments of present invention provide a MRAM device that includes a MTJ stack 10. The MTJ stack 10 may include a reference layer 300, a tunnel barrier layer 401 on top of the reference layer 300, and a free layer 510 on top of the tunnel barrier layer 401. The free layer 510 may include, in one embodiment, a first CoFeB layer 511, a spacer layer 512 on top of the first CoFeB layer 511, a second CoFeB layer 513 on top of the spacer layer 512, and a capping layer 514 on top of the second CoFeB layer 513.

In one embodiment, the spacer layer 512 may be a multilayer spacer such as an alloy formed from a stack of alternating layers of non-magnetic metal, such as refractory metal, and magnetic metal, such as iron (Fe). For example, the spacer layer 512 may be formed from a set of refractory metal layers 5121 and a set of iron layers 5122 and the set of refractory metal layers 5121 and the set of iron layers 5122 are placed alternatingly. Hereinafter, the term "set" may include one or more than one. In other words, the set of refractory metal layers 5121 may be separated by the set of iron layers 5122 or the set of iron layers 5122 may be separated by the set of refractory metal layers 5121. In one embodiment, the stack of alternating layers may include at least two layers of the refractory metal and one layer of iron. The refractory metal, for example, may be zirconium (Zr), niobium (Nb), molybdenum (Mo), hafnium (Hf), tantalum (Ta), rhenium (Re), and/or tungsten (W).

During formation of the spacer layer 512, the refractory metal layers 5121 may each be formed to have a thickness between about 0.05 nm and about 0.4 nm. This range of thickness is important as it ensures that the spacer layer 512 formed thereby may have adequate amount of refractory metal to provide sufficient absorption of boron while in the meantime not causing the iron layers 5122 placed above and below the refractory metal layers 5121 to be decoupled magnetically from each other due to thickness of the refractory metal layers 5121. Further for example, the iron layers 5122 may each be formed to have a thickness between about 0.3 nm and about 1.0 nm. This range of thickness is important as well as it ensures that the iron layers 5122 have sufficient magnetic power or force to couple with each other and with the first and the second CoFeB layer 511 and 513 below and above the spacer layer 512. The refractory metal layers 5121 and the iron layers 5122 may combine together to form an alloy. The first and the second CoFeB layer 511 and 513 may be substantially depleted of boron because of the unique multilayer structure of the spacer layer 512, particularly because of the multiple boron absorbing refractory metal layers 5121.

The tunnel barrier layer 401 may be a magnesium-oxide (MgO) layer and the capping layer 514 may be a MgO layer as well. The first CoFeB layer 511 may include a first region 5111 that is adjacent to the tunnel barrier layer 401. By being in contact with the MgO of the tunnel barrier layer 401 and relatively (compared with a second region 5112 of the first CoFeB layer 511) away from the spacer layer 512, the first region 5111 of the first CoFeB layer 511 includes highly crystallized cobalt-iron (CoFe). The highly crystallized first region 5111 of the first CoFeB layer 511 helps provide high tunnel magnetoresistance (TMR) for improved performance of the MRAM device.

On the other hand, the capping layer 514 may be a MgO layer as well. The second CoFeB layer 513 may include a first region 5131 that is adjacent to the capping layer 514. By being in contact with the MgO of the capping layer 514 and relatively (compared with a second region 5132 of the second CoFeB layer 513) away from the spacer layer 512, the first region 5131 of the second CoFeB layer 513 includes highly crystallized CoFe as well. The highly crystallized first region 5131 of the second CoFeB layer 513 helps provide high perpendicular magnetic anisotropy (PMA) and high retention of states.

In the meantime, the first CoFeB layer 511 may include the second region 5112 that is adjacent to the spacer layer 512 and the second CoFeB layer 513 may include the second region 5132 that is adjacent to the spacer layer 512 as well. By being closer (than the first regions 5111 and 5131 respectively) to the spacer layer 512 and particularly closer to the refractory metal such as Nb, the second regions 5112 and 5132 are mostly kept at an amorphous state to include amorphous CoFe alloy. The amorphous CoFe alloy helps improve the uniformity of the first and the second CoFeB layer 511 and 513 for a more uniform device performance.

In one non-limiting example, the first region 5111 of the first CoFeB layer 511 may have a thickness that is between about 20% to about 40% of an overall thickness of the first CoFeB layer 511. For example, the first region 5111 may have a thickness between about 0.2 nm and about 0.5 nm while the second region 5112 may have a thickness between about 0.2 nm and about 0.7 nm. Similarly, the first region 5131 of the second CoFeB layer 513 may have a thickness that is between about 20% to about 40% of an overall thickness of the second CoFeB layer 513. For example, the first region 5131 may have a thickness between about 0.2 nm and about 0.5 nm while the second region 5132 may have a thickness between about 0.2 nm and about 0.7 nm.

As is illustrated in FIG. 1, the spacer layer 512 may be formed to start with a refractory metal layer 5121 directly above the first CoFeB layer 511 and end with another refractory metal layer 5121 directly underneath the second CoFeB layer 513. In this case, the spacer layer 512 formed thereby may have an overall iron content ranging from about 20 at. % to about 80 at. %. However, embodiments of present invention are not limited in this aspect. The spacer layer 512 could have different arrangement of the refractory metal layers, i.e., non-magnetic layers and the iron layers, i.e., magnetic layers as are described below in more details.

Figure 2:
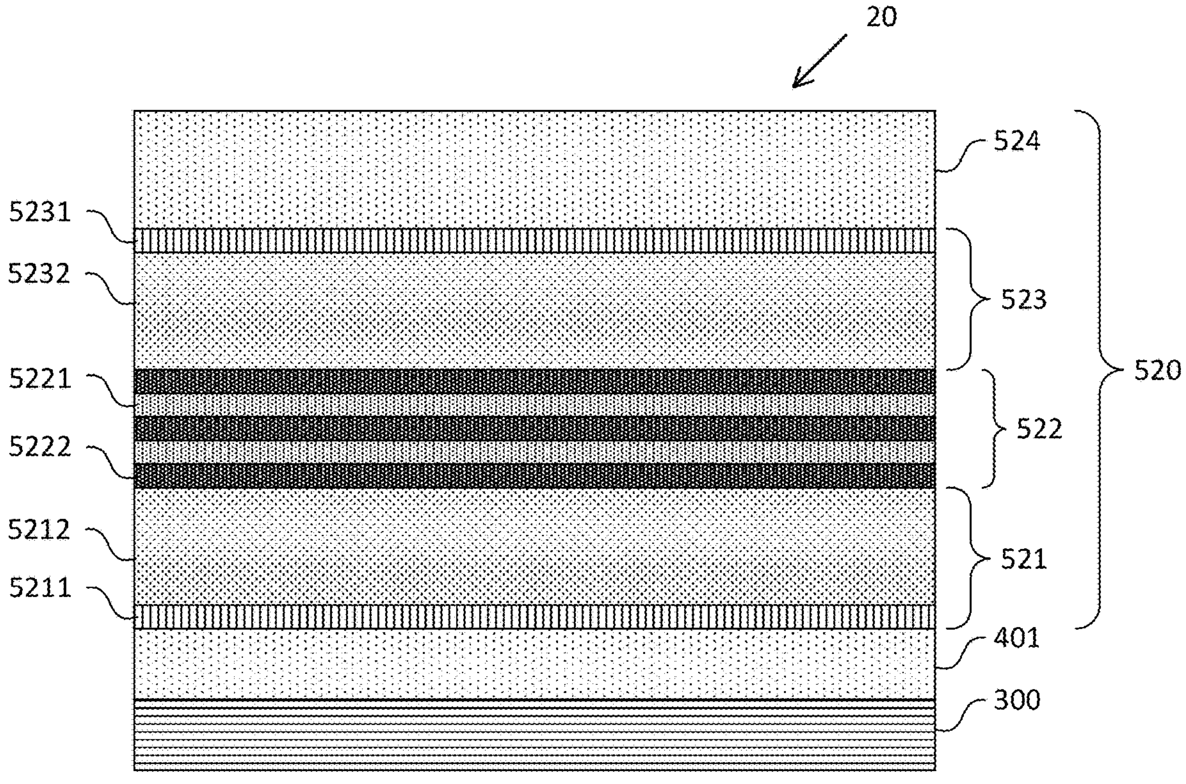
FIG. 2 is a demonstrative illustration of cross-sectional view of a semiconductor structure according to another embodiment of present invention.

FIG. 2 is a demonstrative illustration of cross-sectional view of a semiconductor structure according to another embodiment of present invention. More particularly, embodiments of present invention provide a MRAM device that includes a MTJ stack 20. Similar to the MTJ stack 10 illustrated in FIG. 1, the MTJ stack 20 may include a reference layer 300, a tunnel barrier layer 401 on top of the reference layer 300, and a free layer 520 on top of the tunnel barrier layer 401. The free layer 520 may include, in one embodiment, a first CoFeB layer 521, a spacer layer 522 on top of the first CoFeB layer 521, a second CoFeB layer 523 on top of the spacer layer 522, and a capping layer 524 on top of the second CoFeB layer 523.

The spacer layer 522 may be formed, for example, from a stack of alternating layers including a set of refractory metal layers 5221 of non-magnetic metal, and a set of iron layers 5222 of magnetic metal. However, embodiments of present invention are not limited in this aspect. In one embodiment, the spacer layer 522 may be formed through sputtering from an alloy target containing refractory metal such as Nb and magnetic metal such as Fe, instead of forming a multilayer structure of refractory metal layers and magnetic metal layers.

Different from the spacer layer 512 in FIG. 1, the spacer layer 522 may start with an iron layer 5222 directly on top of the first CoFeB layer 521 and end with another iron layer 5222 directly underneath the second CoFeB layer 523. In this case, the spacer layer 522 formed thereby may have an overall iron content ranging from about 20 at. % to about 80 at. %. Starting with an iron layer 5222 may help prevent refractory metal, such as niobium (Nb) that forms the refractory metal layers 5221, from travelling to the MgO layer at the interface between the first CoFeB layer 521 and the tunnel barrier layer 401. If the heavy iron atoms of the iron layer 5222 does not exist, this travelling could happen because the first CoFeB layer 521 is usually very thin, in the order of 1 nm. Because the niobium atoms do not carry spin polarization, preventing niobium atoms from travelling down to the interface with the MgO layer helps prevent the potential lowering of overall TMR. On the other hand, controlling the amount of iron is also important since excessive amount of iron may cause reduction in PMA.

The first and the second CoFeB layer 521 and 523 are substantially depleted of boron because of the unique multilayer structure of the spacer layer 522 that includes sufficient amount of boron absorbing niobium atoms. The first CoFeB layer 521 may include a first region 5211 of mostly highly crystallized CoFe and a second region 5212 of amorphous CoFe alloy. Similarly, the second CoFeB layer 523 may include a first region 5231 of mostly highly crystallized CoFe and a second region 5232 of amorphous CoFe alloy. This local crystallinity of highly crystallized CoFe near the MgO, and the amorphous CoFe alloy at rest of the first and the second CoFeB layer 521 and 523, help create a structure of the free layer 520 that helps achieve higher TMR, higher PMA, and improved retention of states while maintaining low write currents when being used in making MRAM, compared with those MRAM that uses a conventional free layer.

Figure 3:
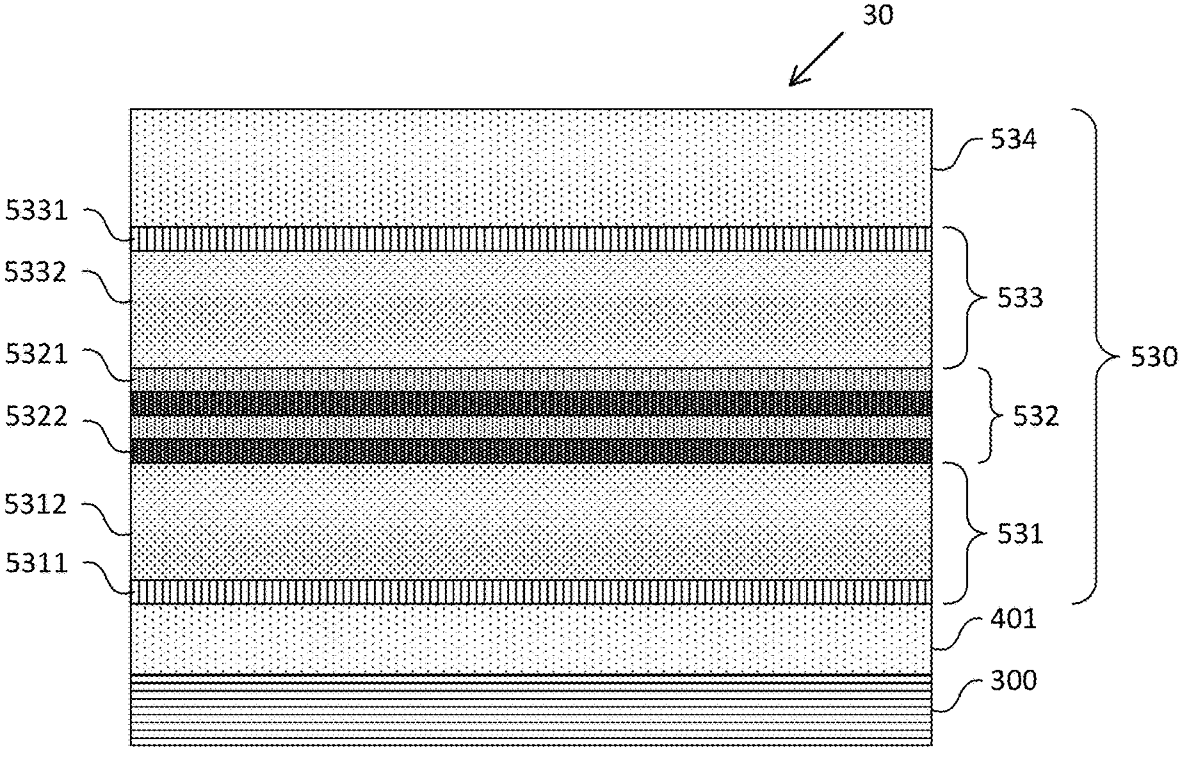
FIG. 3 is a demonstrative illustration of cross-sectional view of a semiconductor structure according to yet another embodiment of present invention.

FIG. 3 is a demonstrative illustration of cross-sectional view of a semiconductor structure according to yet another embodiment of present invention. More particularly, embodiments of present invention provide a MRAM device that includes a MTJ stack 30. Similar to the MTJ stack 10 illustrated in FIG. 1, the MTJ stack 30 may include a reference layer 300, a tunnel barrier layer 401 on top of the reference layer 300, and a free layer 530 on top of the tunnel barrier layer 401. The free layer 530 may include, in one embodiment, a first CoFeB layer 531, a spacer layer 532 on top of the first CoFeB layer 531, a second CoFeB layer 533 on top of the spacer layer 532, and a capping layer 534 on top of the second CoFeB layer 533.

The spacer layer 532 may be a multilayer spacer and may be formed from a stack of alternating layers including a set of refractory metal layers 5321 of non-magnetic metal, and a set of iron layers 5322 of magnetic metal. In this case, the spacer layer 522 formed thereby may have an overall iron content ranging from about 20 at. % to about 80 at. %. Different from the spacer layer 512 in FIG. 1 and the spacer layer 522 in FIG. 2, the spacer layer 532 may start with an iron layer 5322 (or a refractory metal layer) directly on top of the first CoFeB layer 531 and end with a refractory metal layer 5321 (or an iron layer) directly underneath the second CoFeB layer 533.

The first CoFeB layer 531 may include a first region 5311 of mostly highly crystallized CoFe and a second region 5312 of amorphous CoFe alloy. Similarly, the second CoFeB layer 533 may include a first region 5331 of mostly highly crystallized CoFe and a second region 5332 of amorphous CoFe alloy. Both the first and the second CoFeB layer 531 and 533 are substantially depleted of boron because of the unique multilayer structure of the spacer layer 532. Different from a conventional spacer layer, the spacer layer 532 includes sufficient amount of boron absorbing niobium atoms.

Figure 4:
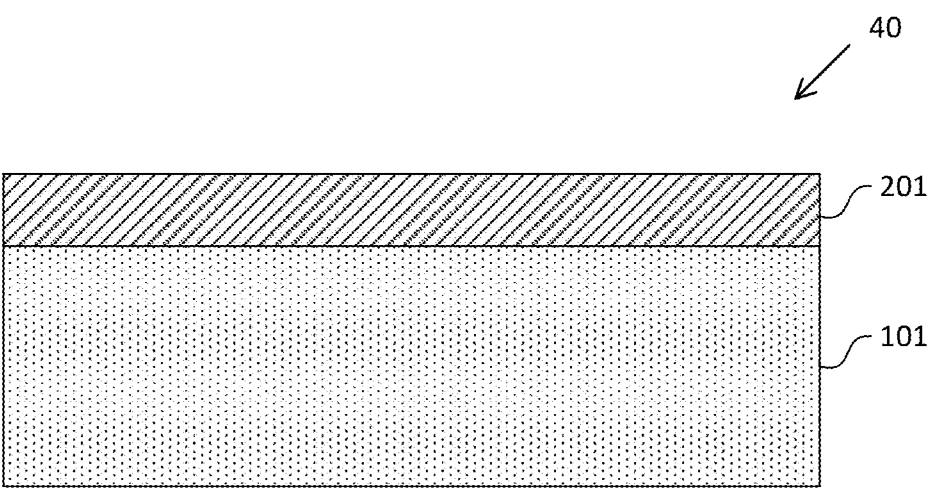
FIGS. 4-11 are demonstrative illustrations of cross-sectional views of a semiconductor structure at various stages of manufacturing thereof according to several embodiments of present invention.
Figure 5:
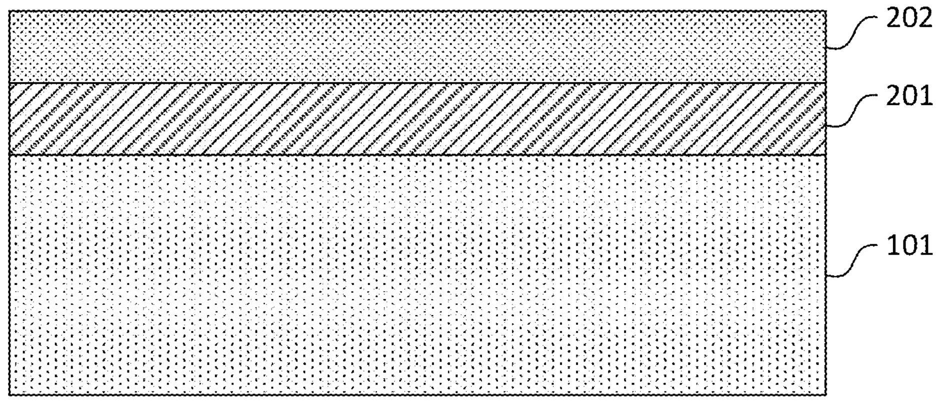

FIGS. 4-11 are demonstrative illustrations of cross-sectional views of a semiconductor structure at various stages of manufacturing thereof according to several embodiments of present invention. More particularly, embodiments of present invention provide forming a MTJ stack 40 by receiving or providing a semiconductor substrate 101, such as a silicon (Si) substrate, and forming a diffusion barrier layer 201, which may be an amorphous tantalum (Ta) and/or tantalum-nitride (TaN) layer, on top of the semiconductor substrate 101 as is illustrated in FIG. 4. Subsequently, a CoFeB layer 202 may be deposited in amorphous state onto the diffusion barrier layer 201 of amorphous Ta/TaN layer as is illustrated in FIG. 5.

Figure 6:
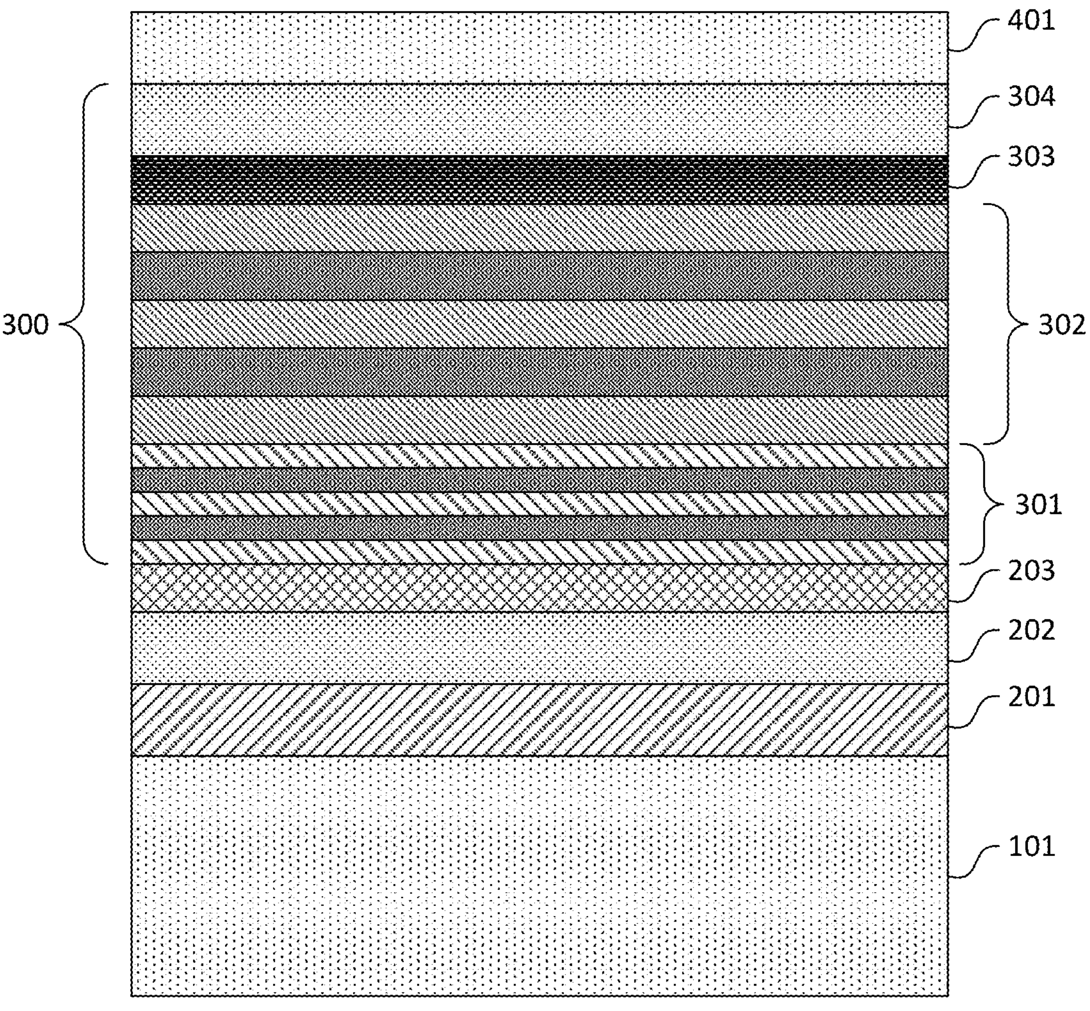

Embodiments of present invention further provide, as is illustrated in FIG. 6, forming a seed layer 203 such as a ruthenium (Ru) layer and/or platinum (Pt) layer on top of the amorphous CoFeB layer 202 such that the seed layer 203 stays in amorphous state; forming a reference layer 300 on top of the seed layer 203; and forming a tunnel barrier layer 401 on top of the reference layer 300.

In one embodiment, the reference layer 300 may have a multilayer structure. For example, the reference layer 300 may include a first stack of alternating layers 301 of cobalt and platinum; a second stack of alternating layers 302 of cobalt and iridium on top of the first stack of alternating layers 301; a tungsten (W) layer 303 on top of the second stack of alternating layers 302; and another amorphous CoFeB layer 304 on top of the tungsten layer 303.

Figure 7:
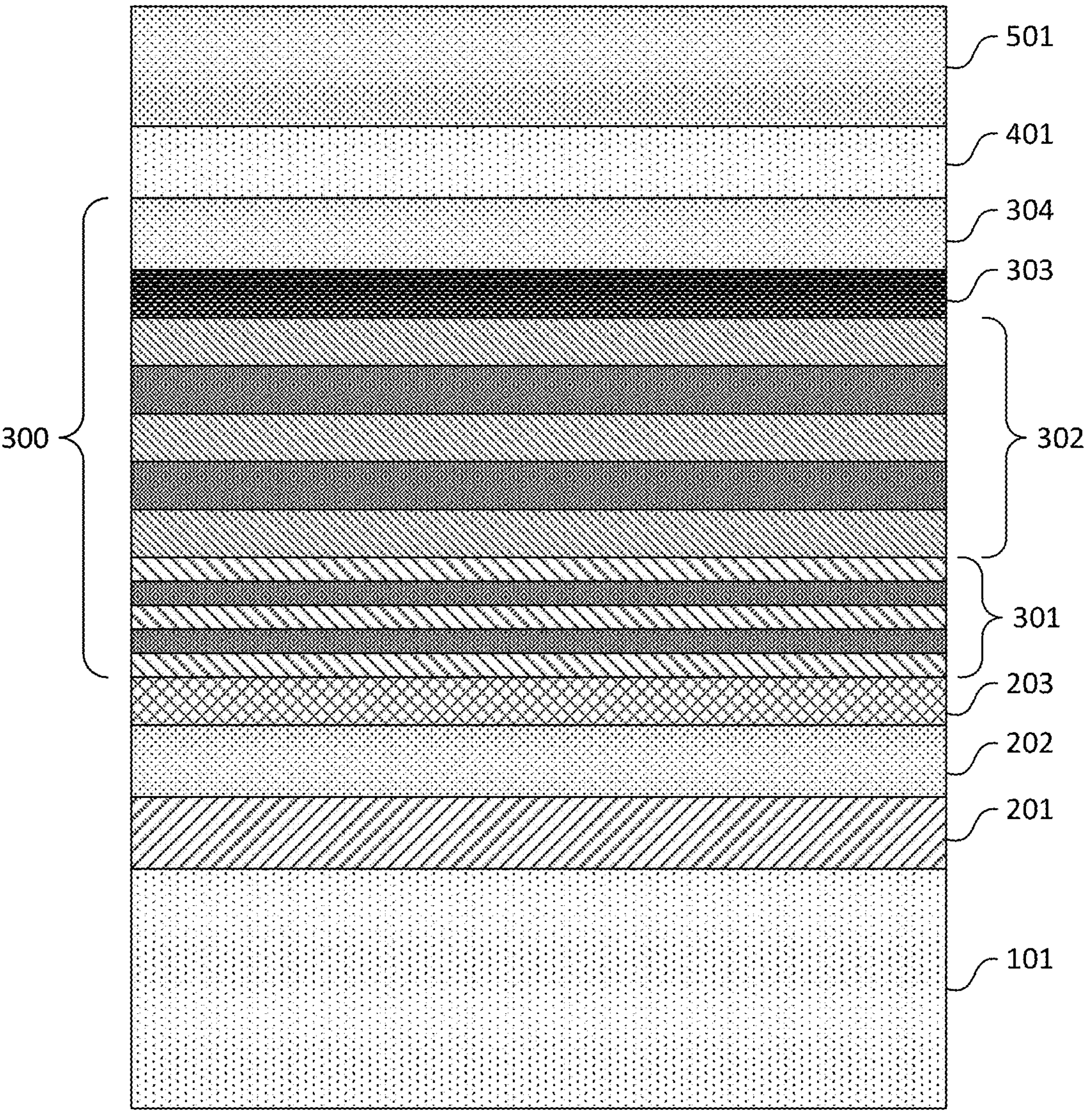
Figure 8:
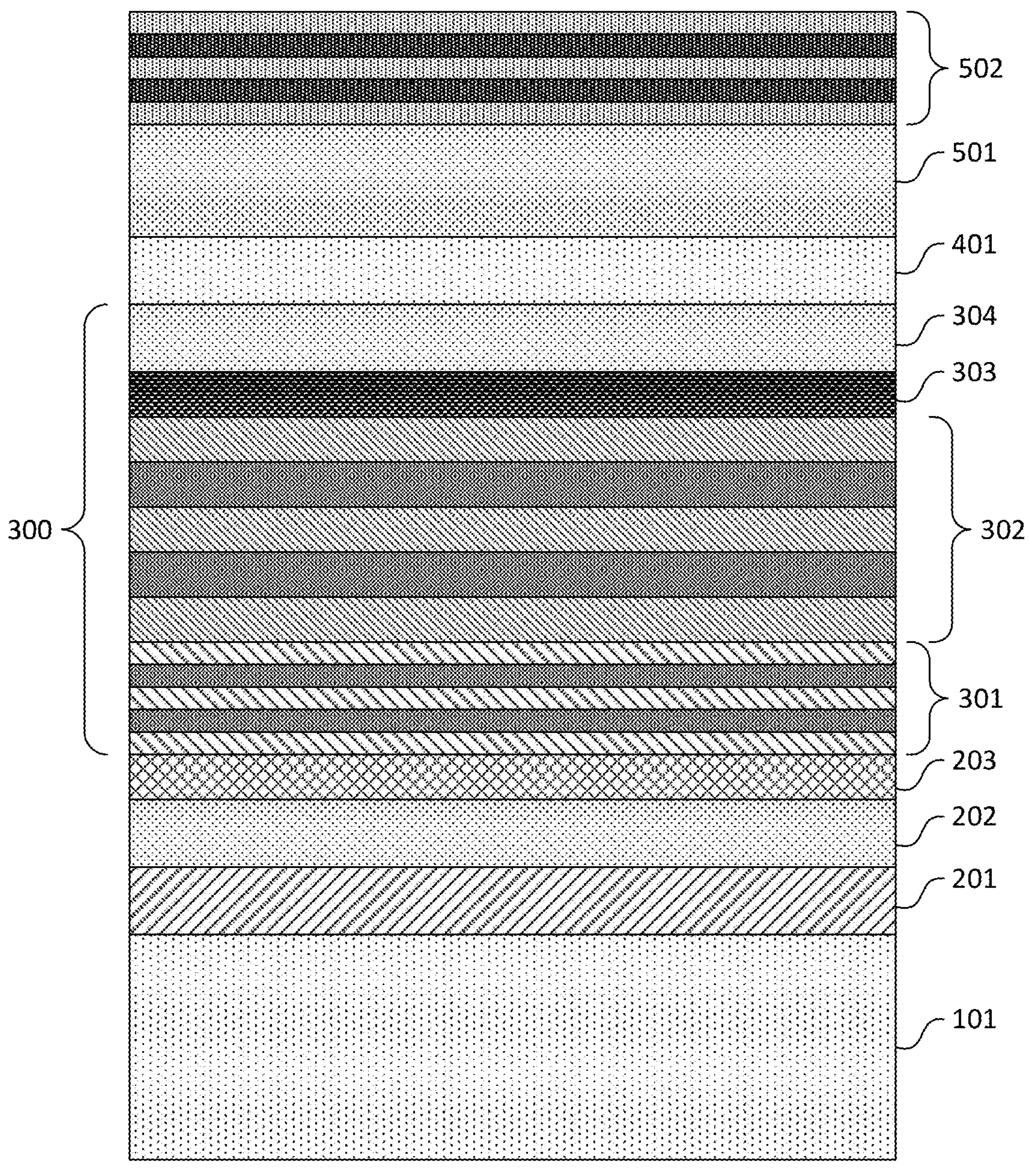
Figure 9:
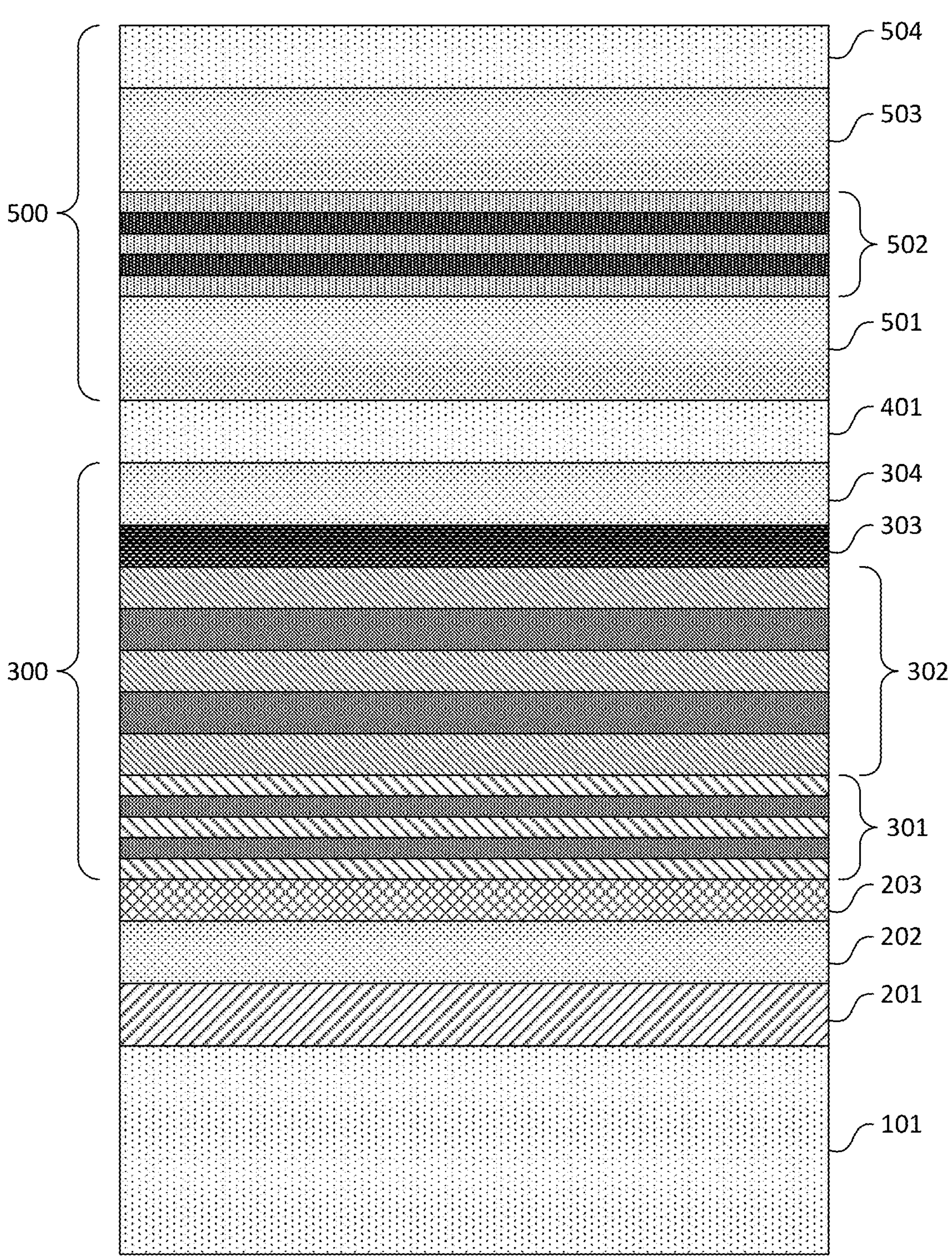
Figure 10:
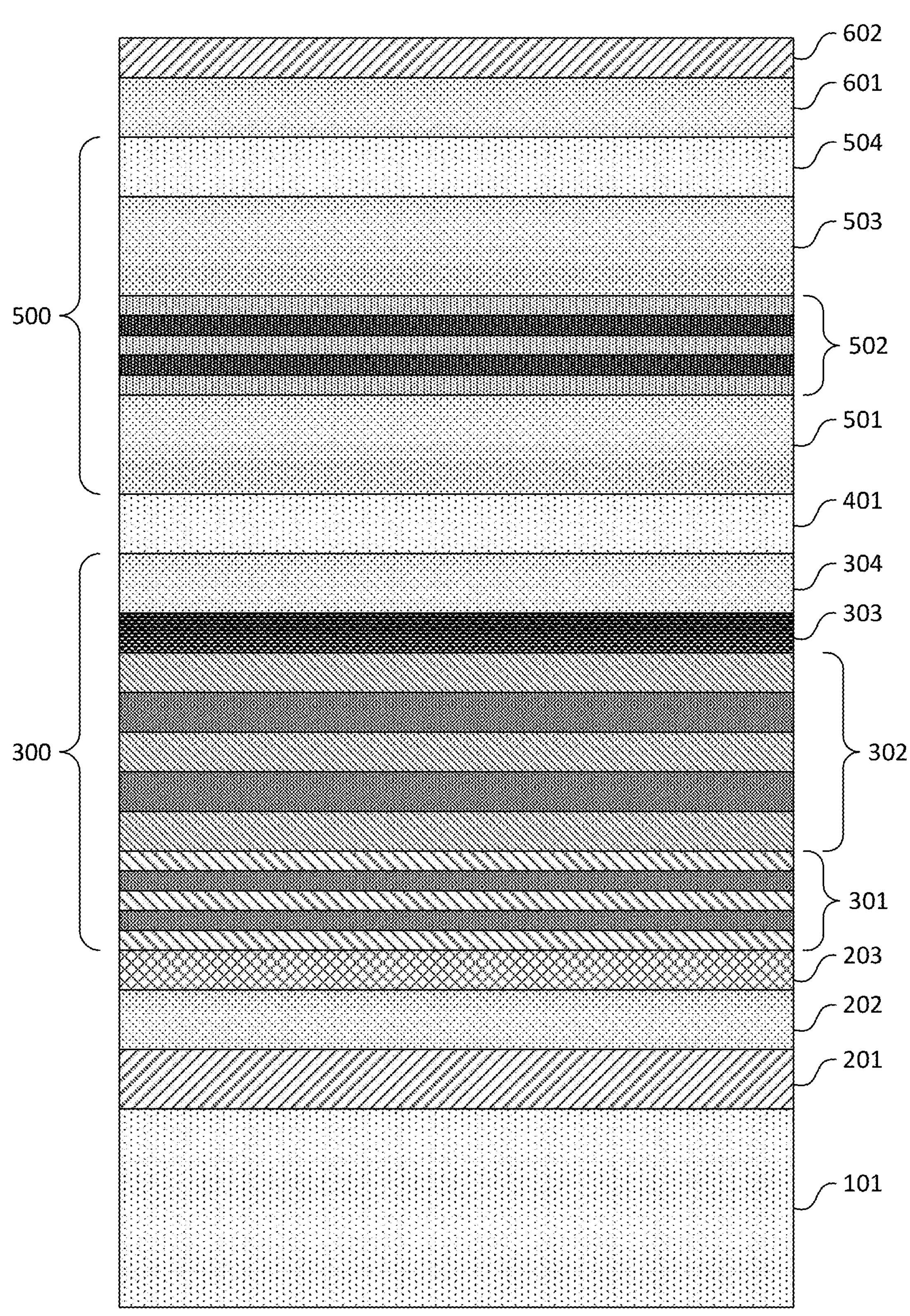
Figure 11:
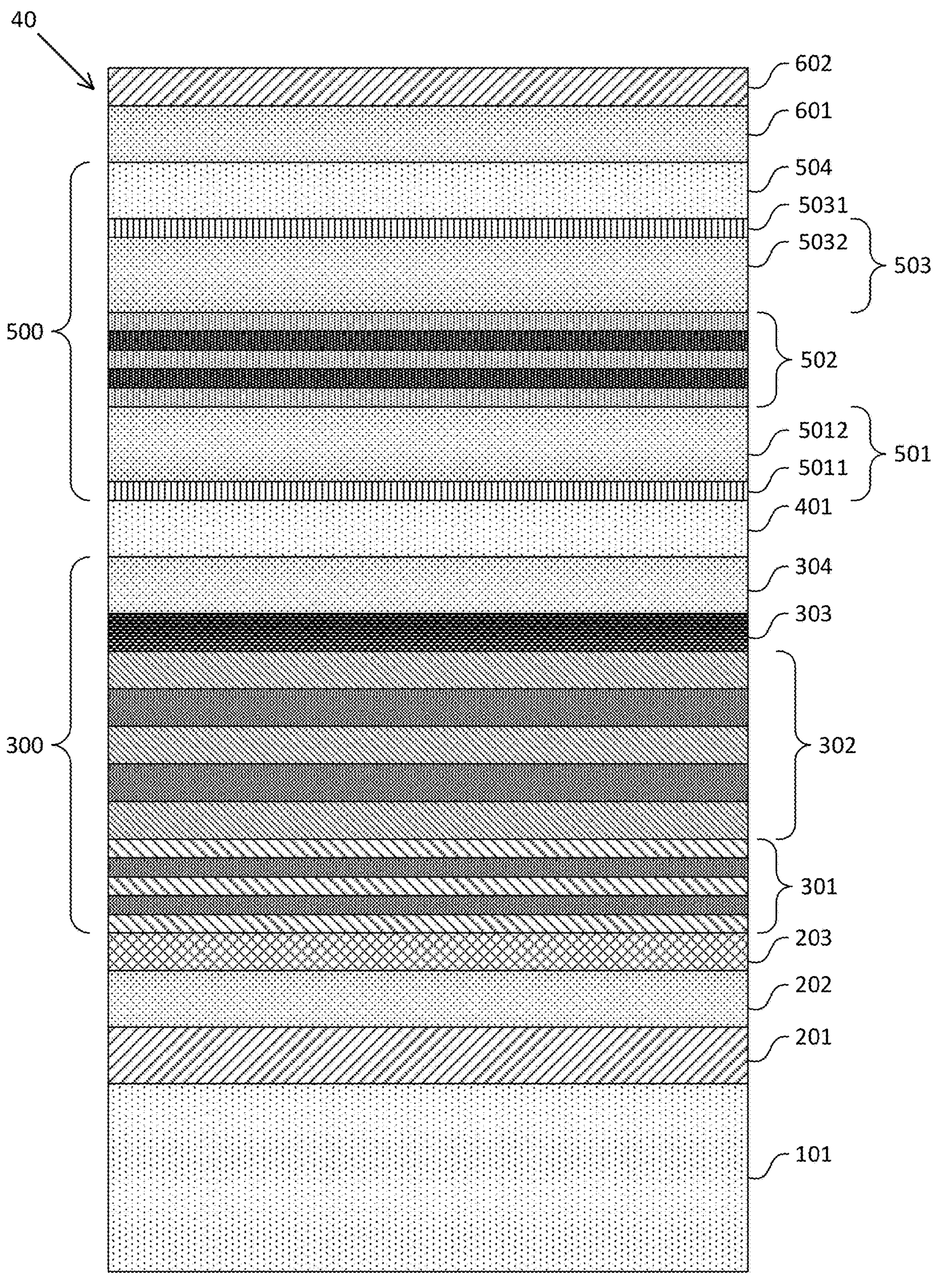

Embodiments of present invention may further provide forming a free layer structure on top of the tunnel barrier layer 401. In doing so, embodiments of present invention provide forming a first CoFeB layer 501, in an amorphous state, on top of the tunnel barrier layer 401 as is illustrated in FIG. 7; forming a spacer layer 502 on top of the first CoFeB layer 501 as is illustrated in FIG. 8; and forming a second CoFeB layer 503 on top of the spacer layer 502 as is illustrated in FIG. 9 and forming a capping layer 504 on top of the second CoFeB layer 503. The spacer layer 502 may have a structure similar to any of the spacer layers 512, 522, and 532 as illustrated in FIG. 1, FIG. 2, and FIG. 3, respectively, whose structures and material composition are described above in details with respect to their respective drawings. The capping layer 504 may be a MgO layer that helps increase the PMA of the free layer 500, thereby lowering the write voltage of the MRAM device.

After forming the free layer according to embodiments of present invention, another CoFeB layer 601 may be deposited, in amorphous state, on top of the free layer 500 and a capping layer 602 on top of the CoFeB layer 601, both of which may further help or improve the PMA of the free layer 500.

According to one embodiment of present invention, the MTJ stack 40 may be subject to one or more annealing processes at a temperature ranging from about 300 degree C. to about 435 degree C., typically between about 380 degree C. and 420 degree C. The annealing processes may be made in conjunction with thermal cycles of other CMOS devices for a total duration from around tens of minutes to a few hours. During the annealing process, boron atoms and particularly those boron atoms in the first CoFeB layer 501 and in the second CoFeB layer 503 may be attracted and/or absorbed by the refractory metal layers, such as niobium metal layers, and the iron layers in the spacer layer 502, with some possibly diffusing into the nearby MgO layer of the tunnel barrier layer 401 and the capping layer 504, resulting a first CoFeB layer 501 and a second CoFeB layer 503 that are substantially depleted of boron. For example, the first and the second CoFeB layer 501 and 503 may have a boron content or boron concentration level less than 5 at. %.

In the meantime, being in contact with the MgO, the first regions 5011 and 5031 may include crystallized CoFe thereby resulting in higher TMR and PMA of the free layer 500. On the other hand, being close to the niobium in the spacer layer 502, the second regions 5012 and 5032 may include amorphous CoFe alloy which helps better wetting and overall uniformity of the MRAM device.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions above have been presented for the purposes of illustration of various embodiments of present invention and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A magnetoresistive random-access-memory (MRAM) comprising:
- a reference layer;
- a tunnel barrier layer of magnesium-oxide (MgO); and
- a free layer, wherein the free layer comprises:
  - a first cobalt-iron-boron (CoFeB) layer on top of the tunnel barrier layer;
  - a spacer layer on top of the first CoFeB layer;
  - a second CoFeB layer on top of the spacer layer; and
  - a capping layer of MgO on top of the second CoFeB layer,
  - wherein the first and the second CoFeB layer include respectively a first region adjacent to the tunnel barrier layer and the capping layer respectively and a second region adjacent to the spacer layer, wherein the first regions of the first and the second CoFeB layer include crystallized cobalt-iron (CoFe) and the second regions of the first and the second CoFeB layer include amorphous CoFe alloy, and
  - wherein the spacer layer includes two layers of iron and three layers of a refractory metal stacked alternately with the two layers of iron, wherein each of the two layers of iron has a thickness between 0.5 nm and 1.0 nm to have magnetic power to couple with the first and the second CoFeB layer; a middle layer of the three layers of the refractory metal has a thickness between 0.05 nm and 0.3 nm such that it does not magnetically decouple the two layers of iron from each other; and each of the two outer layers of the three layers of the refractory metal has a thickness between 0.1 nm and 0.4 nm to provide absorption of boron but do not decouple the two layers of iron from the first and the second CoFeB layer, which directly contact the two outer layers of the three layers of the refractory metal with the bottom outer layer of the three layers of the refractory metal in direct contact with the first CoFeB layer and the top outer layer of the three layers of the refractory metal in direct contact with the second CoFeB layer.

2. The MRAM of claim 1, wherein the spacer layer includes a concentration level of iron ranging from 20 at. % to 80 at. %.

3. The MRAM of claim 1, wherein the first regions of the first and the second CoFeB layer are depleted of boron.

4. The MRAM of claim 1, wherein the first region of the first CoFeB layer has a thickness that is between 20% to 40% of a thickness of the first CoFeB layer.

5. The MRAM of claim 1, wherein a thickness of the first region of the first CoFeB layer is between 0.2 nm and 0.5 nm, and a thickness of the second region of the first CoFeB layer is between 0.2 nm and 0.7 nm.

6. A magnetoresistive random-access-memory (MRAM) comprising:
- a reference layer;
- a tunnel barrier layer above the reference layer; and
- a free layer above the tunnel barrier layer, wherein the free layer includes:
  - a first cobalt-iron-boron (CoFeB) layer on top of the tunnel barrier layer;
  - a spacer layer on top of the first CoFeB layer;
  - a second CoFeB layer on top of the spacer layer; and
  - a capping layer on top of the second CoFeB layer;
  - wherein the spacer layer is an alloy of a refractory metal and iron including two layers of iron with each having a thickness between 0.5 nm and 1.0 nm and three layers of the refractory metal stacked alternately with the two layers of iron and a thickness of the layer of the refractory metal between the two layers of iron is between 0.05 nm and 0.3 nm such that it does not magnetically decouple the two layers of iron, with the iron having a concentration level ranging from 20 at. % to 80 at. % of the alloy.

7. The MRAM of claim 6, wherein the refractory metal is selected from a group consisting of zirconium (Zr), niobium (Nb), hafnium (Hf), and rhenium (Re).

8. The MRAM of claim 6, wherein the tunnel barrier layer is a layer of magnesium-oxide (MgO) and the first CoFeB layer is directly on top of the tunnel barrier layer, the first CoFeB layer is depleted of boron (B) to include a first region adjacent to the tunnel barrier layer and a second region adjacent to the spacer layer; wherein the first region includes crystallized cobalt-iron (CoFe) and the second region includes amorphous CoFe alloy.

9. The MRAM of claim 8, wherein the first region of the first CoFeB layer has a thickness that is between 20% to 40% of a thickness of the first CoFeB layer.

10. The MRAM of claim 8, wherein a thickness of the first region of the first CoFeB layer is between 0.2 nm and 0.5 nm, and a thickness of the second region of the first CoFeB layer is between 0.2 nm and 0.7 nm.

11. The MRAM of claim 6, wherein the capping layer is a layer of magnesium-oxide (MgO) and is directly on top of the second CoFeB layer, the second CoFeB layer is depleted of boron (B) to include a first region adjacent to the capping layer and a second region adjacent to the spacer layer; wherein the first region includes crystallized cobalt-iron (CoFe) and the second region includes amorphous CoFe alloy.

12. A magnetic tunnel junction (MTJ) stack comprising:
- a reference layer;
- a tunnel barrier layer above the reference layer; and
- a free layer above the tunnel barrier layer,
  - wherein the free layer includes a first cobalt-iron-boron (CoFeB) layer; a spacer layer of an alloy comprising a refractory metal and iron; a second CoFeB layer; and a capping layer, wherein the refractory metal is zirconium (Zr), niobium (Nb), hafnium (Hf), or rhenium (Re), and the spacer layer being sandwiched between the first and the second CoFeB layer, and
  - wherein the spacer layer includes two layers of iron and three layers of the refractory metal stacked alternately with the two layers of iron, wherein each of the two outer layers of the refractory metal has a thickness between 0.1 nm and 0.4 nm to provide absorption of boron; each of the two layers of iron has a thickness between 0.5 nm and 1.0 nm to have magnetic power to couple with the first and the second CoFeB layer; and the layer of the refractory metal between the two layers of iron has a thickness between 0.05 nm and 0.3 nm to not magnetically decouple the two layers of iron.

13. The MTJ stack of claim 12, wherein the tunnel barrier layer is a layer of magnesium-oxide (MgO), and the first CoFeB layer is directly on top of the tunnel barrier layer to include a first region adjacent to the tunnel barrier layer and a second region adjacent to the spacer layer; wherein the first region includes crystallized cobalt-iron (CoFe) and the second region includes amorphous CoFe alloy.

14. The MTJ stack of claim 13, wherein both the first region and the second region of the first CoFeB layer include less than 5 at. % of boron.

15. The MTJ stack of claim 13, wherein a thickness of the first region of the first CoFeB layer is between 0.2 nm and 0.5 nm, and a thickness of the second region of the first CoFeB layer is between 0.2 nm and 0.7 nm.

16. The MTJ stack of claim 12, wherein the spacer layer includes a concentration level of iron ranging from 20 at. % to 80 at. %.

* * * * *